US006983168B2

(12) United States Patent
Chen et al.

(10) Patent No.: US 6,983,168 B2

(45) Date of Patent: Jan. 3, 2006

(54) BACK LIGHT HOLDER FOR A MOBILE PHONE

(75) Inventors: Wei-Chih Chen, Pingtung (TW); Chin-Kai Sun, Taipei (TW)

(73) Assignee: BenQ Corporation, (TW)

( * ) Notice: Subject to any disclaimer, the term of this patent is extended or adjusted under 35 U.S.C. 154(b) by 378 days.

(21) Appl. No.: 09/814,752

(22) Filed: Mar. 23, 2001

(65) Prior Publication Data

US 2001/0046857 A1 Nov. 29, 2001

(30) Foreign Application Priority Data

May 26, 2000 (TW) .............................. 89110317 A

(51) Int. Cl.
*H04B 1/38* (2006.01)

(52) U.S. Cl. .................... 455/550.1; 455/566; 345/76; 345/87; 345/102; 337/79; 337/206; 337/241; 337/242; 337/361

(58) Field of Classification Search ................ 455/566, 455/550.1; 345/76, 87, 102; 337/361, 79, 337/206, 241, 242
See application file for complete search history.

(56) References Cited

U.S. PATENT DOCUMENTS 5,216,803 A * 6/1993 Nolan et al. .................. 29/829
6,052,606 A * 4/2000 Bowen ....................... 455/566
2001/0006380 A1 * 7/2001 Jeong ......................... 345/102
2001/0035853 A1 * 11/2001 Hoelen et al. ............. 345/102

* cited by examiner

*Primary Examiner*—Vivian Chin
*Assistant Examiner*—Sanh Phu
(74) *Attorney, Agent, or Firm*—Arent Fox PLLC

(57) ABSTRACT

The present invention relates to a mobile phone including a main printed circuit board. A first connector and a second connector are welded respectively onto a first predetermined location and a second predetermined location of the main printed circuit board, wherein a first power supply and a second power supply are provided respectively by the first connector and the second connector. The main printed circuit board includes a first portion corresponding to a keypad module and a second portion corresponding to an LCM module. The mobile phone also provides a holder, wherein a space is included in the holder to accommodate the LCM module. A slit is formed at a predetermined location of the holder. The mobile phone further includes a secondary printed circuit board carrying a plurality of LEDs to provide a back light source. The secondary printed circuit disposed within the aforementioned slit includes a first contact point and a second contact point. The first contact point contacts correspondingly with the first connector, and the second contact point contacts correspondingly with the second connector.

3 Claims, 5 Drawing Sheets

BACK LIGHT HOLDER FOR A MOBILE PHONE

FIELD OF THE INVENTION

The present invention relates to a mobile phone structure and more particularly to a mobile phone structure with a back light holder.

BACKGROUND OF THE INVENTION

Typically, back light sources of prior mobile phones include LED and electro-luminescent lamp. The main printed circuit board of the mobile phone mainly includes a first portion corresponding to the keypad module and a second portion corresponding to the LCM module. As known in the prior art, the back light source is used to illuminate the LCM module or the keypad module. It enables users clearly read alpha-numerical keypads in the keypad area or words and patterns in the LCM area.

When using the LED as a back light source, a plurality of the LEDs is welded onto the first portion of the main printed circuit board to illuminate the keypad module. In order to illuminate the LCM module, a holder is designed to include a space for accommodating the LCM module, and a slit is formed at a predetermined location for accommodating a secondary printed circuit board. The secondary printed circuit board carries a plurality of the LEDs to provide a back light source for illuminating the LCM module.

Generally speaking, the secondary printed circuit board is a lengthwise sheet, and it forms a first lateral short leg and a second lateral short leg at its two ends respectively. An electrode is disposed on each lateral leg. In the mean time, a first contact point and a second contact point are disposed on the main printed circuit board corresponding to the aforementioned two lateral short legs. The first contact point and the second contact point provide a first reference power supply and a second reference power supply respectively. After the secondary printed circuit board is disposed within the slit, the first lateral short leg is to be welded onto the first contact point and the second lateral short leg is to be welded onto the second contact point. Therefore, the reference power supplies may provide maximum LEDs.

However, the aforementioned processes of welding the first lateral short leg of the secondary printed circuit board onto the first contact point and welding the second lateral short leg onto the second contact point are somewhat minute and complicated. Accordingly, the cost of these processes is higher.

SUMMARY OF THE INVENTION

The present invention provides a structure of a mobile phone and its manufacturing method. The welding process as known in the prior art may be skip, and it lowers the manufacturing cost efficiently.

According to the present invention, both an electro-luminescent sheet and an LED are provided in a mobile phone as back light sources. Users may choose either the electro-luminescent sheet or the LED as the back light source.

According to the present invention, the back light source may be provided to the mobile phone by means of the electro-luminescent sheet.

According to the present invention, the back light source may be provided to the mobile phone by means of the LED.

The mobile phone of the present invention includes a main printed circuit board, a holder, and a secondary printed circuit board. Wherein a first connector and a second connector are welded respectively onto a first predetermined location and a second predetermined location on the main printed circuit board, a first power supply and a second power supply are provided respectively by the first connector and the second connector, the main printed circuit board includes a first portion corresponding to a keypad module and a second portion corresponding to an LCM module. The holder includes a space to accommodate the LCM module, wherein a slit is formed at a predetermined location of the holder. The secondary printed circuit board carries a plurality of LEDs to provide a back light source, wherein the secondary printed circuit board is disposed within the aforementioned slit, the secondary printed circuit board includes a first contact point and a second contact point, wherein the first contact point contacts correspondingly with the first connector, and the second contact point contacts correspondingly with the second connector.

DETAILED DESCRIPTION OF THE PRESENT INVENTION

The present invention provides an improved mobile phone structure and its manufacturing method to solve the problems existing in the prior art.

Figure 1:
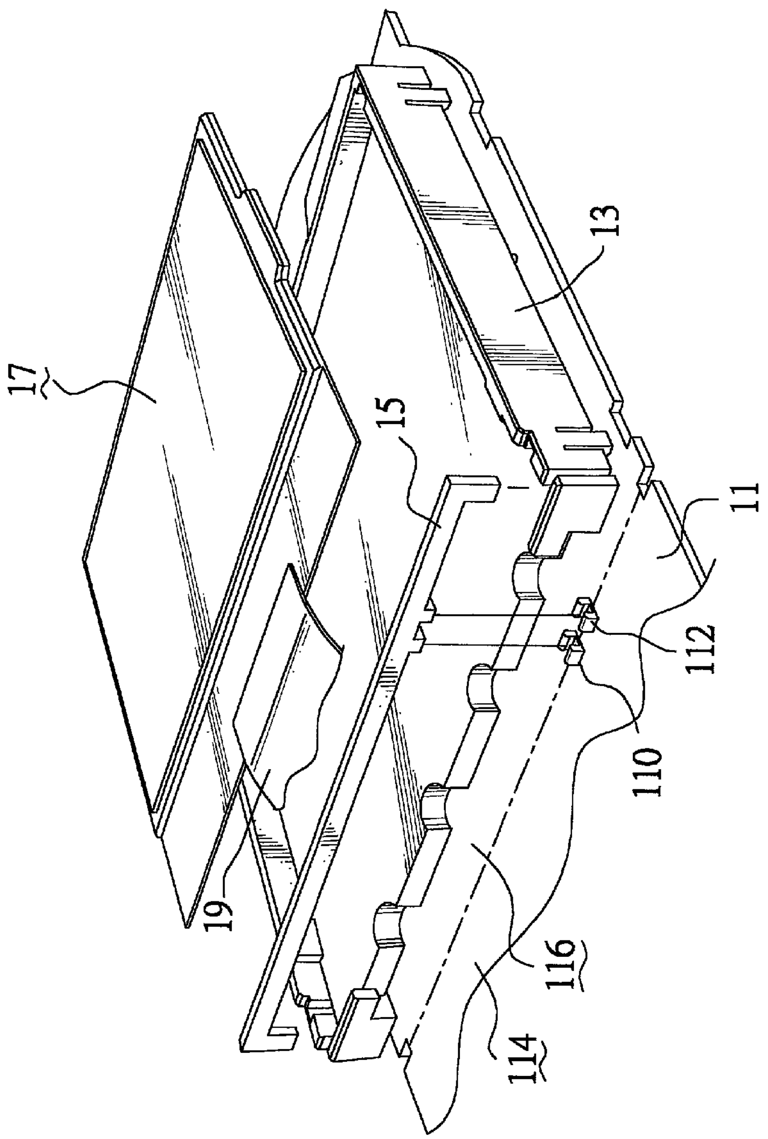
FIG. 1 illustrates the mobile phone structure of the present invention.

An embodiment of the present invention, as shown in FIG. 1, includes a main printed circuit board 11, a holder 13, and a secondary printed circuit board 15.

Figure 2:
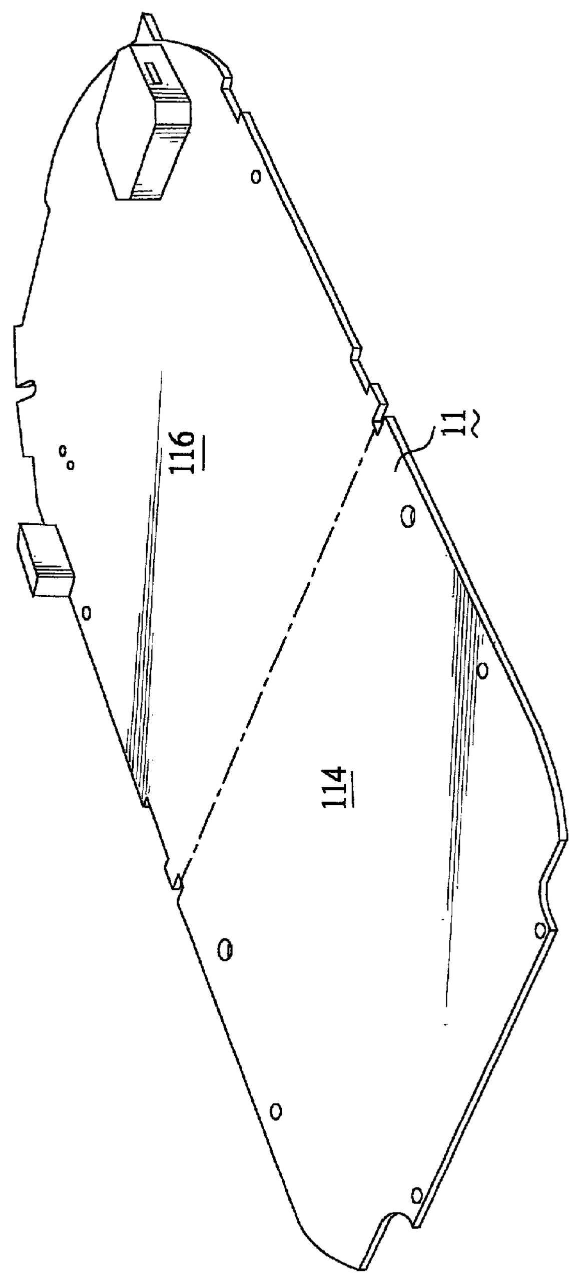
FIG. 2 illustrates the structure of the main printed circuit board 11 as shown in FIG. 1.

The main printed circuit board includes a first connector 112 and a second connector 110 welded respectively onto a first predetermined location and a second predetermined location. A first reference power supply and a second reference power supply are provided respectively by the first connector 112 and the second connector 110. As shown in FIG. 2, the main printed circuit board 11 is divided into a first portion 114 corresponding to a keypad module (not shown) and a second portion 116 corresponding to an LCM module 17. A flat cable assembly 19 is used to connect the LCM module 17 with one of the connectors (not shown) on the main printed circuit board for transmitting the signals between the LCM module 17 and the main printed circuit board 11.

Figure 3:
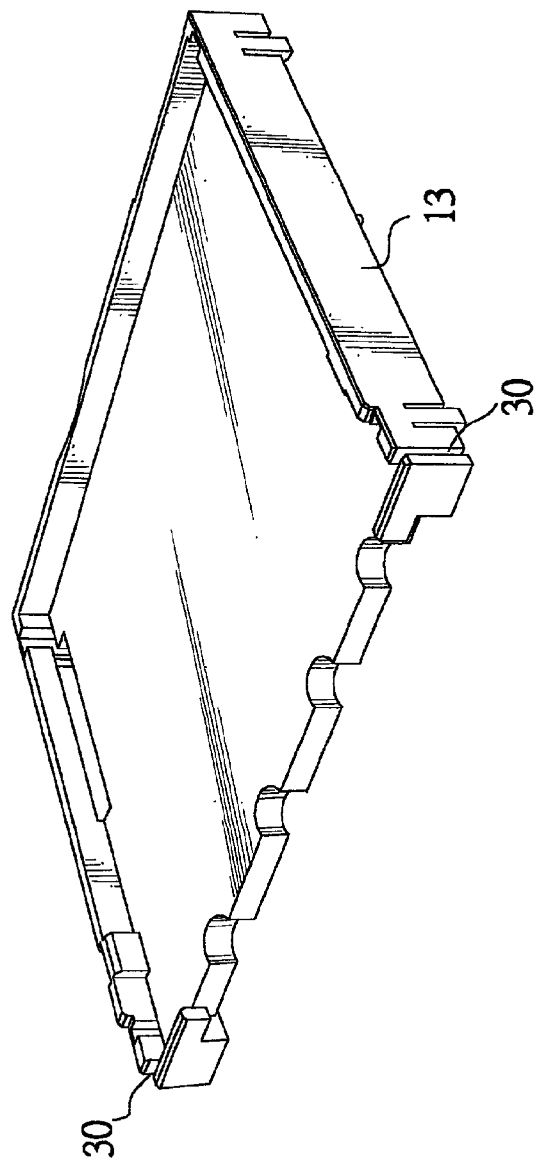
FIG. 3 illustrates the structure of the holder 13 as shown in FIG. 1.

As shown in FIG. 3, the holder 13 includes a space to accommodate the LCM module 17, and a slit 30 is formed at a predetermined location of the holder 13.

Figure 4:
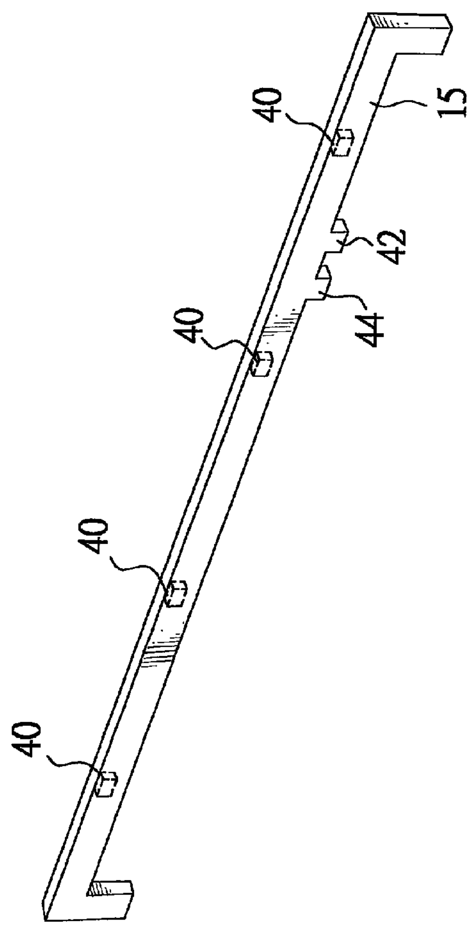
FIG. 4 illustrates the structure of the secondary printed circuit board 15 as shown in FIG. 1.

As shown in FIG. 4, the secondary printed circuit board is a lengthwise sheet for carrying a plurality of LEDs 40 to provide a back light source. The secondary printed circuit board 15 is disposed within the aforementioned slit 30. The secondary printed circuit board 15 includes a first contact point 42 and a second contact point 44. As the assembling process is finished, the first contact point 42 contacts correspondingly with the first connector 112, and the second contact point 44 contacts correspondingly with the second connector 110.

According to a preferred embodiment, the first connector 112 and the second connector 110 are welded onto the main printed circuit board by means of a surface mounting technology (SMT).

According to the embodiment of the present invention, the assembling method of the mobile phone structure is described hereinafter.

(1) As shown in FIG. 1, a first connector 112 and a second connector 110 are welded onto a first predetermined location and a second predetermined location of the main printed circuit board 11 by means of a surface mounting technology.

(2) Insert the secondary printed circuit board 15 within the slit 30 of the holder 13.

(3) Connect the holder 13 with the main printed circuit board 11 to make the first contact point 42 of the secondary printed circuit board 15 contact correspondingly with the first connector 112, and to make the second contact point 44 of the secondary printed circuit board 15 contact correspondingly with the second connector 110. After connected with the main printed circuit board 11, the holder 13 is corresponding to the second portion 116 of the main printed circuit board 11. A preferred embodiment of the connecting method is an engagement connection.

After finishing the above procedure, dispose the corresponding LCM module 17 within the space provided by the holder 13 in a proper order. The rest of the steps of assembling the keypad module, the upper and lower shells, and the batteries are the same as those of the prior art. Therefore they are not further discussed here. The back light source of the mobile phone which is completed herein is provided by the LED.

The above description is based on the case that the LED is provided as a back light source.

Based on the aforementioned main printed circuit board 11, the electro-luminescent sheet may also be provided as a back light source for the mobile phone structure. The corresponding assembling procedure is described hereinafter.

(1) Provide a main printed circuit board 11, wherein the main printed circuit board 11 may be as shown in FIG. 1 or as known in the prior art. However, the main printed circuit board as known in the prior art does not include a first connector 112 and a second connector 110.

(2) Connect a holder 13 with the main printed circuit board 11. A preferred embodiment of the connecting method is an engagement connection. After connected with the main printed circuit board 11, the holder 13 is corresponding to a second portion 116 of the main printed circuit board 11.

(3) Provide an electro-luminescent sheet, primarily including a first portion 54 and a second portion 52.

Figure 5:
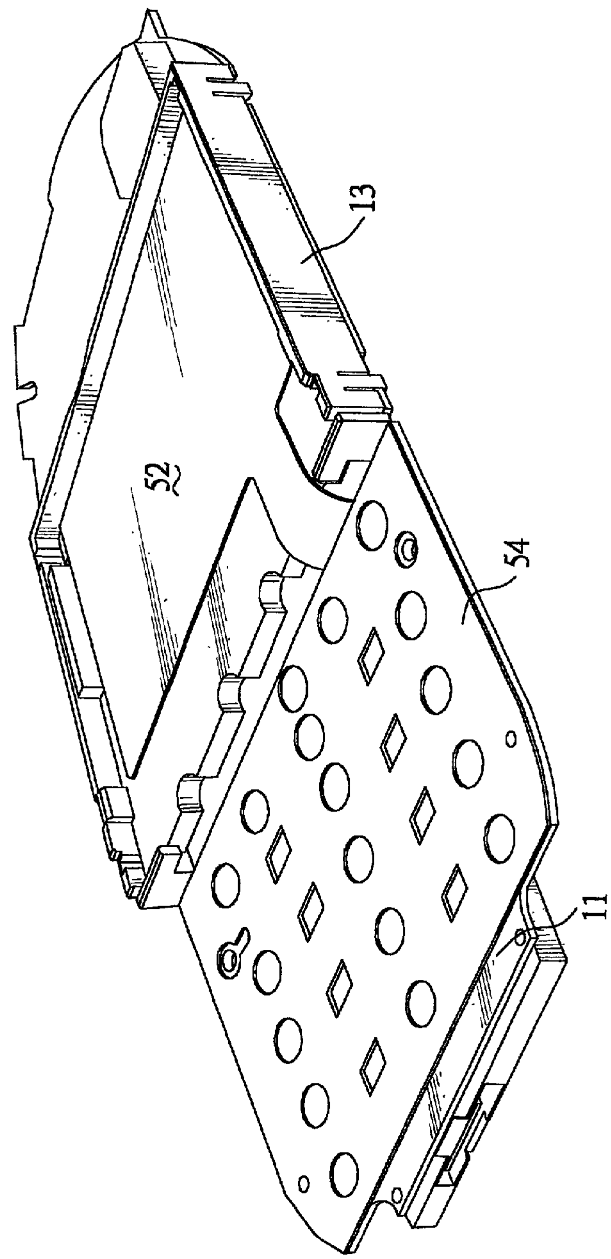
FIG. 5 illustrates that the electro-luminescent sheet is provided as the back light source for the mobile phone of the present invention.

(4) Cover the first portion 54 of the electro-luminescent sheet over the first portion 114 of the main printed circuit board. Accommodate the second portion 52 within the space of the holder 13, as shown in FIG. 5.

After finishing the aforementioned procedure, cover the corresponding LCM module 17 over the second portion 52 of the electro-luminescent sheet in a proper order. The rest of the steps of assembling the keypad module, the upper and lower shells, and the batteries are the same as those of the prior art. Therefore they are not further discussed here. The back light source of the mobile phone which is completed herein is provided by the electro-luminescent sheet.

Based on the aforementioned main printed circuit board 11, the electro-luminescent sheet and the LED may also be provided at the same time as two kinds of back light sources. It is up to the user to choose the electro-luminescent sheet or the LED as the back light source. The corresponding assembling procedure is described hereinafter.

(1) Weld a first connector 112 and a second connector 110 onto a first predetermined location and a second predetermined location of the main printed board 11 by means of a surface mounting technology, as shown in FIG. 1.

(2) Insert the secondary printed circuit board 15 within the slit 30 of the holder 13.

(3) Connect the holder 13 with the main printed circuit board 11 to make the first contact point 42 of the secondary printed circuit board 15 contact correspondingly with the first connector 112, and to make the second contact point 44 of the secondary printed circuit board 15 contact correspondingly with the second connector 110. After connected with the main printed circuit board 11, the holder 13 is corresponding to the second portion 116 of the main printed circuit board 11. A preferred embodiment of the connecting method is an engagement connection.

(4) Provide an electro-luminescent sheet, primarily including a first portion 54 and a second portion 52.

(5) Cover the first portion 54 of the electro-luminescent sheet over the first portion 114 of the main printed circuit board. Accommodate the second portion 52 within the space of the holder 13.

After finishing the aforementioned procedure, cover the corresponding LCM module 17 over the second portion 52 of the electro-luminescent sheet in a proper order. The rest of the steps of assembling the keypad module, the upper and lower shells, and the batteries are the same as those of the prior art. Therefore they are not further discussed here. The back light source of the mobile phone which is completed herein is provided by either the electro-luminescent sheet or the LED according to user's choice.

In order to let users choose the electro-luminescent sheet and the LED as the back light source, an electronic circuit and the associated firmware function are to be provided to the main printed circuit board. The user enters the menu of the mobile phone and chooses to use either the electro-luminescent sheet or the LED as the back light source. However, it is not a key point of the present invention, and therefore it is not further described herein.

The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A mobile phone having a keypad module and an LCM module, comprising:

a main printed circuit board, a first connector and a second connector being welded respectively onto a first predetermined location and a second predetermined location on the main printed board, a first reference power supply and a second reference power supply being provided respectively to said first connector and said second connector, said main printed circuit board being divided into a first portion corresponding to said keypad module and a second portion corresponding to said LCM module;

a holder, said holder comprising a space accommodating said LCM module, said holder comprising a slit at a predetermined location of said holder;

a secondary printed circuit board for carrying a plurality of LEDs to provide a back light source, said secondary printed circuit board being disposed within said slit, said secondary printed circuit board comprising a first contact point and a second contact point, wherein said first contact point removably contacts with said first connector and said second contact point removably contacts with said second connector; and an electro-luminescent sheet providing another back light source.

2. A mobile phone having a keypad module and an LCM module, comprising:

a main printed circuit board, a first connector and a second connector being welded respectively onto a first predetermined location and a second predetermined location on the main printed board, a first reference power supply and a second reference power supply being provided respectively to said first connector and said second connector, said main printed circuit board being divided into a first portion corresponding to said keypad module and a second portion corresponding to said LCM module;

a holder, said holder comprising a space accommodating said LCM module, said holder comprising a slit at a predetermined location of said holder;

a secondary printed circuit board for carrying a plurality of LEDs to provide a back light source, said secondary printed circuit board being disposed within said slit, said secondary printed circuit board comprising a first contact point and a second contact point, wherein said first contact point removably contacts with said first connector and said second contact point removably contacts with said second connector; and an electro-luminescent sheet providing another back light source, wherein said electro-luminescent sheet primarily comprises a first portion and a second portion, wherein said first portion of said main printed circuit board is covered by said first portion of said electro-luminescent sheet, said second portion of said electro-luminescent is disposed within said space of said holder, and said LCM module is located and disposed over said second portion of said electro-luminescent sheet.

3. A method for assembling a holder onto a main printed circuit board of a mobile phone, said mobile phone comprising a keypad module, an LCM module, said holder, and a secondary printed circuit board, said main printed circuit board comprising a first portion corresponding to said keypad module and a second portion corresponding to said LCM module, a space being provided in said holder to accommodate said LCM module, a slit being formed at a predetermined location of said holder, said secondary printed circuit board carrying a plurality of LEDs to provide a back light source, said secondary printed circuit board comprising a first contact point and a second contact point, the method comprising the following steps:

(1) welding, by a surface mounting technology, a first connector and a second connector respectively onto a first predetermined location and a second predetermined location of said main printed circuit board;

(2) inserting said secondary printed circuit board within said slit of said holder;

(3) connecting said holder with said main printed circuit board in order to make said first contact point of said secondary printed circuit contact removably with said first connector, and to make said second contact point of said secondary printed circuit contact removably with said second connector;

(4) providing an electro-luminescent sheet substantially including a first portion and a second portion; and (5) covering over said first portion of said main printed circuit board by said first portion of said electro-luminescent sheet, and disposing said second portion of said electro-luminescent sheet within said space of said holder.

* * * * *